(12) United States Patent
Ota et al.

(10) Patent No.: US 11,221,350 B2
(45) Date of Patent: Jan. 11, 2022

(54) PROBE DEVICE FOR IMPROVING TRANSFER ACCURACY OF NEEDLE TRACES OF PROBES AND NEEDLE TRACE TRANSCRIPTION METHOD THEREFOR

(71) Applicant: TOKYO ELECTRON LIMITED, Tokyo (JP)

(72) Inventors: Tomohiro Ota, Yamanashi (JP); Kazumi Yamagata, Yamanashi (JP); Mitsushiro Mochizuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 105 days.

(21) Appl. No.: 16/624,385

(22) PCT Filed: Jun. 14, 2018

(86) PCT No.: PCT/JP2018/022726
§ 371 (c)(1),
(2) Date: Dec. 19, 2019

(87) PCT Pub. No.: WO2018/235718
PCT Pub. Date: Dec. 27, 2018

(65) Prior Publication Data
US 2020/0124641 A1    Apr. 23, 2020

(30) Foreign Application Priority Data
Jun. 23, 2017  (JP) .............................. JP2017-123644

(51) Int. Cl.
*G01R 1/073* (2006.01)
*G01R 31/28* (2006.01)

(52) U.S. Cl.
CPC ..... *G01R 1/07314* (2013.01); *G01R 31/2836* (2013.01)

(58) Field of Classification Search
CPC ............ G01R 31/2891; G01R 31/2887; G01R 31/2889; G01R 1/07342; G01R 3/00;
(Continued)

(56) References Cited

U.S. PATENT DOCUMENTS

| 6,111,421 A * | 8/2000 | Takahashi .......... G01R 31/2868 324/750.04 |
| 6,498,504 B2 * | 12/2002 | Miyagi .............. G01R 1/07314 324/754.15 |

(Continued)

FOREIGN PATENT DOCUMENTS

| JP | 2005-079253 A | 3/2005 |
| JP | 4156968 B2 | 9/2008 |
| JP | 2008-243860 A | 10/2008 |

OTHER PUBLICATIONS

PCT International Search Report and Written Opinion, PCT Application No. PCT/JP2018/022726, dated Sep. 4, 2018, 7 pages.

*Primary Examiner* — Vinh P Nguyen
(74) *Attorney, Agent, or Firm* — Fenwick & West LLP (57) ABSTRACT

A probe device according to an embodiment is a probe device for inspecting electrical characteristics of an inspection target object, mounted on a mounting table, by electrically contacting probes and the inspection target object to each other. The probe device includes a support base having on an upper surface thereof a needle trace transfer member for transferring needle traces of the probes, a fixed support portion extending from a side of the mounting table and configured to fix and support the support base from below, and a movable support unit that is disposed below the support base and is configured to be moved up and down to be in contact with the support base and movably support the support base.

8 Claims, 7 Drawing Sheets

(58) Field of Classification Search
CPC .... G01R 1/07364; G01R 1/07307; G01R 35/00;
G01R 1/04; G01R 31/2886; G01R 1/073;
G01R 1/07314; G01R 1/07378; G01R
1/0466; G01R 31/2831; G01R 31/2893;
G01R 1/0491; G01R 1/06794; G01R
31/2601; G01R 1/06722; G01R 1/06727;
G01R 1/0735; G01R 31/26; G01R
31/2853; G01R 31/2863; G01R 31/2865;
G01R 31/2884; G01R 35/005; G01R
1/0408; G01R 1/06733; G01R 1/06777;
G01R 31/2846; G01R 31/2851; G01R
31/2868; G01R 31/2881; G01R 31/311;
G01R 31/312; G01R 1/02; G01R
1/06705; G01R 1/06711; G01R 1/06744;
G01R 1/07371; G01R 1/07392; G01R
27/26; G01R 31/002; G01R 31/2806;
G01R 31/2808; G01R 31/2829; G01R
31/2836; G01R 31/2894; G01R 31/2896;
G01R 31/31717; H01L 21/68; H01L
22/14; G06F 11/221; G06F 13/409; G06F
3/0338; H01R 12/714; H01R 12/73;
H01R 2201/20; G11B 5/455
See application file for complete search history.

(56) References Cited

U.S. PATENT DOCUMENTS

| | | | | |
|---|---|---|---|---|
| 7,405,584 B2* | 7/2008 | Fujita | ............... | G01R 31/2891 |
| | | | | 324/750.19 |
| 7,772,862 B2* | 8/2010 | Yamada | ............ | G01R 31/2891 |
| | | | | 324/754.01 |
| 8,212,577 B2* | 7/2012 | Yamada | ............ | G01R 31/2891 |
| | | | | 324/750.03 |
| 10,209,273 B2* | 2/2019 | Takesako | ............... | G01R 3/00 |

* cited by examiner

| SUPPORT BASE IS SUPPORTED | SUPPORT BASE IS NOT SUPPORTED |
|---|---|
| 12.0μm | 53.3μm |

PROBE DEVICE FOR IMPROVING TRANSFER ACCURACY OF NEEDLE TRACES OF PROBES AND NEEDLE TRACE TRANSCRIPTION METHOD THEREFOR

TECHNICAL FIELD

The present disclosure relates to a probe device and a needle trace transcription method.

BACKGROUND

Conventionally, there is known a probe device for bringing an inspection target object mounted on a mounting table into electrical contact with probes and inspecting electrical characteristics of the inspection target object (see, e.g., Patent Document 1). In the probe device disclosed in Patent Document 1, the probes are brought into contact with a needle trace transfer member mounted on a support member cantilevered by the mounting table, and needle tip positions of the probes are transferred to the needle trace transfer member. Then, position coordinates of the transferred needle traces of the probes and position coordinates of reference electrode pads of the inspection target object are detected by a camera, and the probes and the electrode pads of the inspection target object are aligned based on the position coordinates.

PRIOR ART

Patent Document 1: Japanese Patent No. 4156968

However, in the above-described probe device, when the probes and the needle trace transfer member are brought into contact with each other, a large load is applied to the needle trace transfer member and, thus, the support member that supports the needle trace transfer member may incline downward. If the support member is inclined downward, the shape of the needle traces transferred to the needle trace transfer member becomes non-uniform, or the positions of the needle traces become misaligned, which may result in deterioration of the transfer accuracy of the needle traces of the probes. Accordingly, the alignment accuracy between the probes and the electrode pads deteriorates.

Therefore, in view of the above, the present invention provides a probe device capable of improving the transfer accuracy of needle traces of probes.

SUMMARY

In accordance with an aspect of the present invention, there is provided a probe device for bringing an inspection target object mounted on a mounting table into electrical contact with probes and inspecting electrical characteristics of the inspection target object, the probe device including: a support base having on an upper surface thereof a needle trace transfer member configured to transfer needle traces of the probes; a fixed support portion extending from a side of the mounting table and configured to fix and support the support base from below; and a movable support unit that is disposed below the support base and is configured to be moved vertically to be in contact with the support base and movably support the support base.

Effect of the Invention

In accordance with the probe device of the present disclosure, the transfer accuracy of the needle traces of the probes can be improved.

DETAILED DESCRIPTION

Hereinafter, embodiments will be described in detail with reference to the accompanying drawings. Like reference numerals will be given to substantially like parts throughout this specification and the drawings, and redundant description thereof will be omitted.

(Probe Device)

Figure 1:
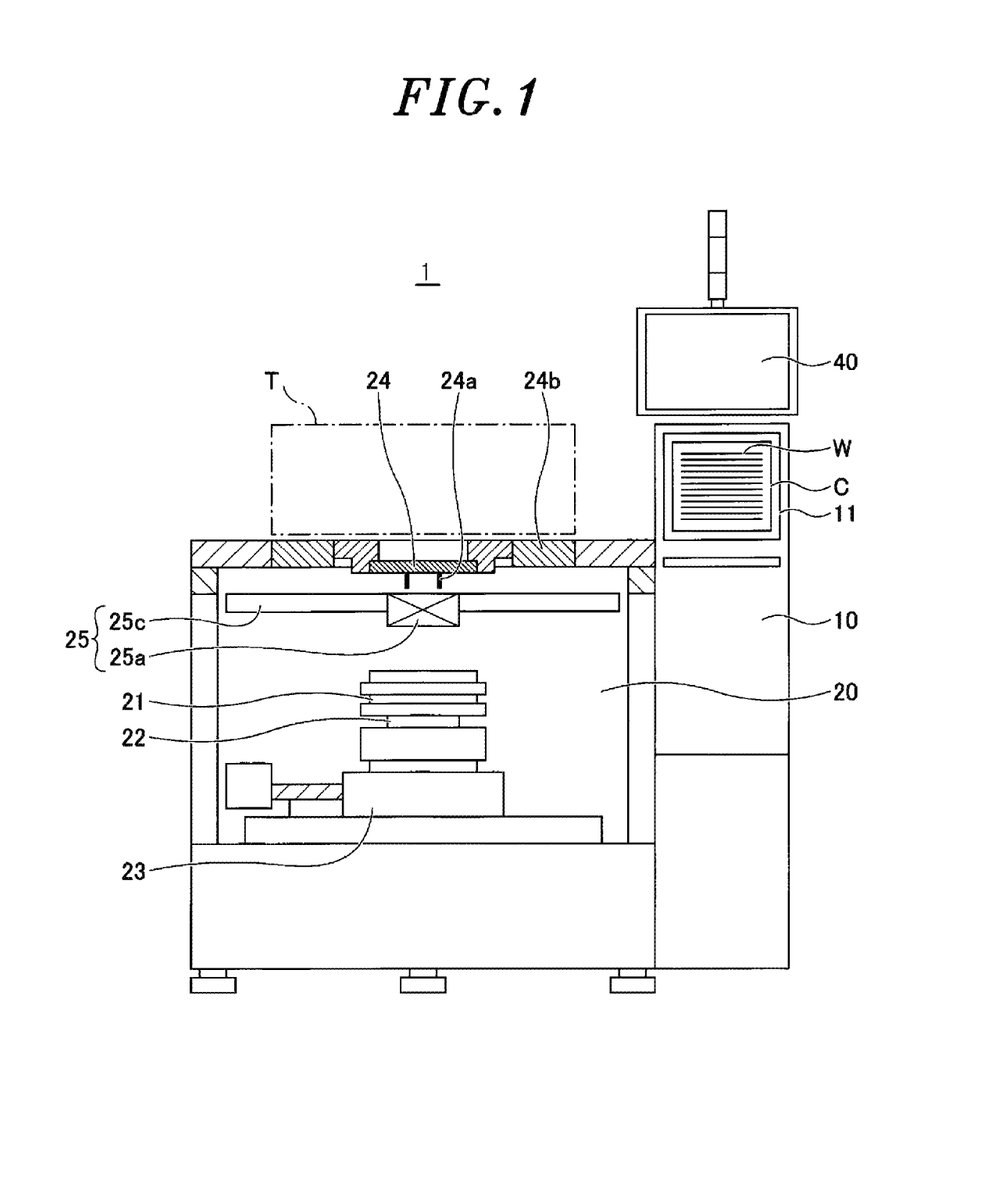
FIG. 1 schematically shows a probe device according to an embodiment of the present invention.
Figure 2:
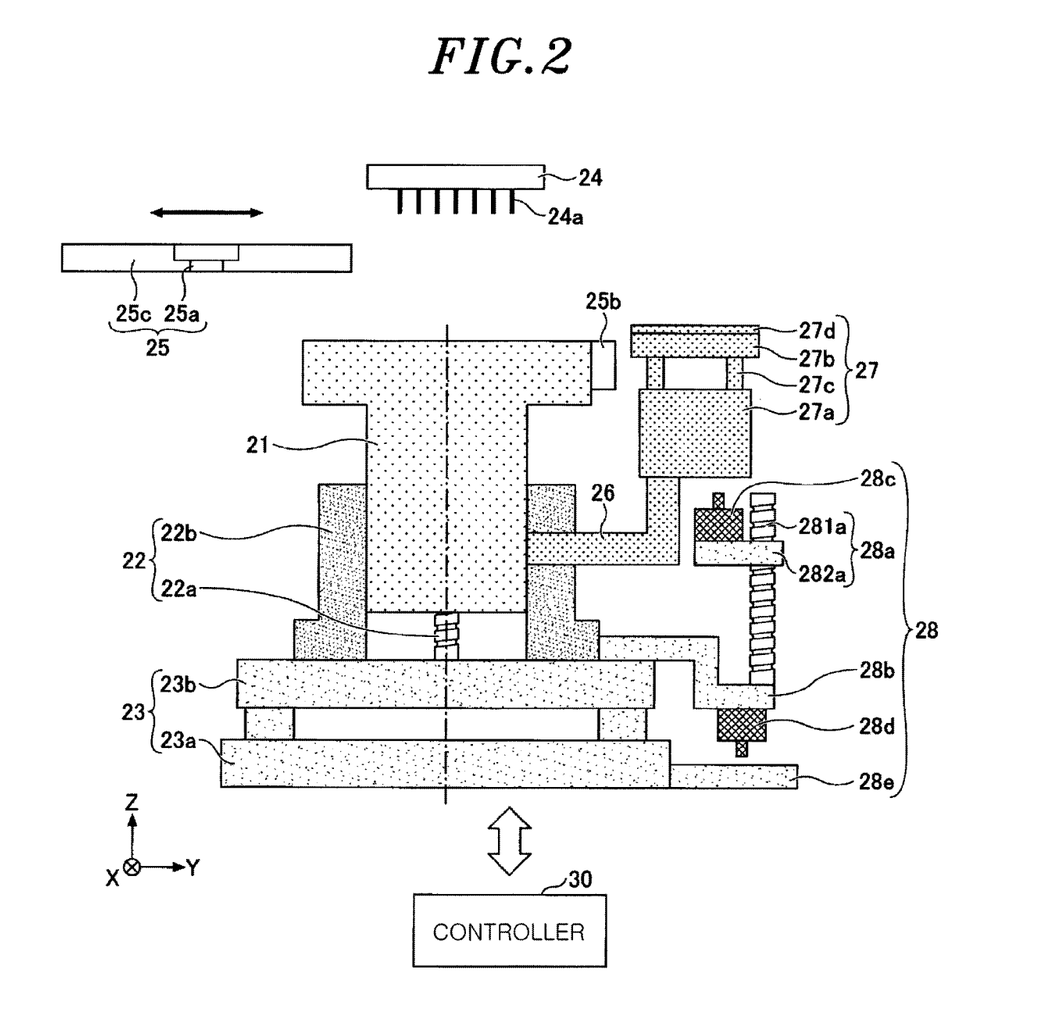
FIG. 2 is a schematic cross-sectional view showing a main configuration of the probe device shown in FIG. 1.

A probe device according to an embodiment of the present invention will be described. FIG. 1 schematically shows a probe device according to an embodiment of the present invention. FIG. 2 is a schematic cross-sectional view showing a main configuration of the probe device shown in FIG. 1.

As shown in FIG. 1, a probe device 1 includes a loader chamber 10 for transferring a semiconductor wafer W that is an inspection target object and a prober chamber 20 disposed near the loader chamber 10 to inspect electrical characteristics of the semiconductor wafer W. The probe device 1 transfers the semiconductor wafer W from the loader chamber 10 to the prober chamber 20 and inspects the electrical characteristics of the semiconductor wafer W in the prober chamber 20 under the control of a controller.

The loader chamber 10 includes a cassette storage unit 11, a wafer transfer mechanism (not shown), and a pre-alignment mechanism (not shown). The wafer transfer mechanism transfers the semiconductor wafer W among a cassette C of the cassette storage unit 11, the pre-alignment mechanism, and the prober chamber 20. The pre-alignment mechanism performs alignment (pre-alignment) of the semiconductor wafer W using an orientation flat, a notch, or the like of the semiconductor wafer W.

As shown in FIG. 2, the prober chamber 20 includes a mounting table 21, an elevating mechanism 22, an XY stage 23, a probe card 24, an alignment mechanism 25, a fixed support portion 26, a support base 27, and a movable support unit 28. In the prober chamber 20, the alignment mechanism 25 is driven under the control of a controller 30 to perform alignment between electrode pads of the semiconductor wafer W on the mounting table 21 and a plurality of probes 24a of the probe card 24. Then, the probes 24a are brought into electrical contact with the corresponding electrode pads to inspect the electrical characteristics of the semiconductor wafer W.

The mounting table 21 mounts thereon the semiconductor wafer W. The mounting table 21 includes, e.g., a vacuum chuck or an electrostatic chuck. The mounting table 21 is provided on the XY stage 23 to be vertically movable with respect to the XY stage 23 through the elevating mechanism 22.

The elevating mechanism 22 has a shaft portion 22a and a guide portion 22b. By rotating the shaft portion 22a using a driving mechanism (not shown), the mounting table 21 is vertically moved with respect to the XY stage 23 along the guide portion 22b. In addition, a rotation driving mechanism (not shown) is disposed in the mounting table 21 to rotate the mounting table 21.

The XY stage 23 is disposed at a bottom portion of the prober chamber 20. The XY stage 23 includes a first base portion 23a and a second base portion 23b. The first base portion 23a is disposed at the bottom portion of the prober chamber 20 and moves the mounting table 21 in the Y direction that is a first horizontal direction. The second base portion 23b is disposed on the first base portion 23a and moves the mounting table 21 in the X direction that is a second horizontal direction orthogonal to the Y direction. With this configuration, the mounting table 21 can be moved in two axial directions (X direction and Y direction).

The probe card 24 is disposed above the mounting table 21. The probes 24a are formed at a portion of the probe card 24 that faces the mounting table 21. The probe card 24 is detachably attached to a head plate 24b. A tester (not shown) is connected to the probe card 24 through a test head T. In the probe device 1, the electrical characteristics of the semiconductor wafer W are inspected by applying inspection signals from the tester to the semiconductor wafer W through the test head T and the probes 24a of the probe card 24.

The alignment mechanism 25 includes a first image capturing unit 25a, a second image capturing unit 25b, and an alignment bridge 25c. The first image capturing unit 25a is attached to the center of the alignment bridge 25c to be directed downward and captures images of the semiconductor wafer W and a needle trace transfer member 27d. The second image capturing unit 25b is attached to a side of the mounting base 21 to be directed upward and captures an image of the probes 24a of the probe card 24 from below. The first image capturing unit 25a and the second image capturing unit 25b are, e.g., CCD cameras. The alignment bridge 25c is movable in the horizontal direction (e.g., the Y direction) while supporting the first image capturing unit 25a. Accordingly, the first image capturing unit 25a can be moved by the alignment bridge 25c between a standby position and a position directly below the center of the probe card 24 (hereinafter, referred to as "probe center") under the control of the controller 30. During the alignment, the first image capturing unit 25a disposed at the probe center captures an image of the electrode pads of the semiconductor wafer W on the mounting table 21 from above while the mounting table 21 is moving in the XY direction and displays the captured image on a display device 40 after performing an image processing. During the alignment, the second image capturing unit 25b captures an image of predetermined probes 24a of the probe card 24 from below while the mounting table 21 is moving in the XY direction and displays the captured image on the display device 40 after performing an image processing. In addition, the first image capturing unit 25a captures the image of the needle trace transfer member 27d to be described later and displays the captured image on the display device 40 after performing an image processing.

The fixed support portion 26 extends outward from the side of the mounting table 21, and the support base 27 is attached to the tip end of the fixed support portion 26. The fixed support portion 26 may be formed separately from the mounting table 21 or may be formed integrally with the mounting table 21.

The support base 27 is fixedly supported while being attached to the tip end of the fixed support portion 26. In other words, the support base 27 is cantilevered from below by the fixed support portion 26. Accordingly, the support base 27 can be moved together with the mounting table 21 in the vertical direction (Z direction), the horizontal direction (XY direction), and the rotation direction. The support base 27 includes a fixed portion 27a, a movable portion 27b, an elevating mechanism 27c, and the needle trace transfer member 27d. A part of a bottom surface of the fixed portion 27a is attached to the tip end of the fixed support portion 26. The movable portion 27b is disposed above the fixed portion 27a to be vertically movable with respect to the fixed portion 27a through the elevating mechanism 27c such as a cylinder or the like. The needle trace transfer member 27d is disposed on the upper surface of the movable portion 27b. The needle tips of the probes 24a are brought into contact with the needle trace transfer member 27d, and the needle traces of the probes 24a are transferred on the needle trace transfer member 27d. The needle trace transfer member 27d is made of a material having a hardness that allows the needle traces of the probes 24a to be formed and remain. For example, the needle trace transfer member 27d is made of synthetic resin such as polyimide (PI), polyolefin (PO), polyvinyl chloride (PVC), or the like.

With this configuration, when the movable portion 27b is vertically moved, the upper surface of the needle trace transfer member 27d can be moved between a position lower than the upper surface of the mounting table 21 and a position higher than the upper surface of the semiconductor wafer W mounted on the mounting table 21. For example, when the needle traces of the probes 24a are transferred to the needle trace transfer member 27d, the movable portion 27b is raised such that the upper surface of the needle trace transfer member 27d becomes slightly higher than or equal to the upper surface of the semiconductor wafer W on the mounting table 21. Accordingly, the needle traces of the probe 24a can be transferred to the needle trace transfer member 27d at substantially the same height as the height at which the probes 24a are brought into contact with the electrodes of the semiconductor wafer W. Further, for example, when the mounting table 21 is moved in the horizontal direction by the XY stage 23, the movable portion 27b is lowered such that the height of the upper surface of the needle trace transfer member 27d becomes lower than the upper surface of the mounting table 21. Accordingly, when the mounting table 21 is moved, the needle trace transfer member 27d can be prevented from being in contact with the probes 24a, the alignment mechanism 25, or the like.

The movable support unit 28 is arranged below the support base 27 and is vertically moved to be in contact with the support base 27 to movably support the support base 27. The movable support unit 28 includes an actuator 28a, a third base portion 28b, a first lock mechanism 28c, a second lock mechanism 28d, and a fourth base portion 28e.

The actuator 28a is, e.g., a ball screw in which a nut 282a is vertically moved by rolling of a ball between a screw shaft 281a and the nut 282a. One end (lower end) of the screw shaft 281a is fixed to the upper surface of the third base portion 28b. The third base portion 28b extends outward from the second base portion 23b. The third base portion 28b may be formed separately from the second base portion 23b, or may be formed integrally with the second base portion 23b.

The first lock mechanism 28c is disposed on the nut 282a. The first lock mechanism 28c is vertically moved by the vertical movement of the nut 282a and supports the support base 27 from below while being in contact with the bottom surface of the fixing portion 27a of the support base 27.

Accordingly, even when a large load is applied to the needle trace transfer member 27d by the contact between the needle tips of the probes 24a and the needle trace transfer member 27d, the support base 27 can be prevented from being inclined downward. Therefore, the needle tips of the probes 24a are in perpendicular contact with the needle trace transfer member 27d, which prevents a non-uniform shape of the needle traces transferred to the needle trace transfer member 27d or positional misalignment of the needle traces. As a result, it is possible to suppress deterioration in the transfer accuracy of the needle traces of the probes 24a and improve the accuracy of alignment between the probes 24a and the electrode pads of the semiconductor wafer W. The first lock mechanism 28c has a contact portion such as a spring or the like to be in elastic contact with the bottom surface of the fixing portion 27a. Preferably, the first lock mechanism 28c is locked when the contact portion is in contact with the bottom surface of the fixing portion 27a. Accordingly, the support base 27 can be supported in a state where the first lock mechanism 28c is in reliable contact with the bottom surface of the fixed portion 27a without a gap between the bottom surface of the fixed portion 27a and the first lock mechanism 28c. As such a lock mechanism, it is possible to use an air lock type lock mechanism in which a contact portion operates by air, e.g., Work Support manufactured by KOSMEK LTD.

The second lock mechanism 28d is attached to the bottom surface of the third base portion 28b. When a portion of the third base portion 28b to which the screw shaft 281a is fixed tends to be inclined downward, the second lock mechanism 218d becomes in contact with the upper surface of the fourth base portion 28e to prevent the third base portion 28b from being inclined downward. The second lock mechanism 28d has a contact portion to be elastically in contact with the upper surface of the fourth base portion 28e. Preferably, the second lock mechanism 28d is locked when the contact portion is in contact with the upper surface of the fourth base portion 28e. Therefore, the third base portion 28b can be supported in a state where the second lock mechanism 28d is in reliable contact with the upper surface of the fourth base portion 28e without a gap between the upper surface of the fourth base portion 28e and the second lock mechanism 28d. The second lock mechanism 28d may be configured to be the same as the first lock mechanism 28c. The fourth base portion 28e extends outward from the side of the first base portion 23a. The fourth base portion 28e may be formed separately from the first base portion 23a, or may be formed integrally with the first base portion 23a.

(Needle Trace Transcription Method)

The needle trace transcription method using the above-described probe device 1 will be described. FIGS. 3A to 3D explain an example of the needle trace transcription method according to the embodiment of the present invention.

Figure 3A:
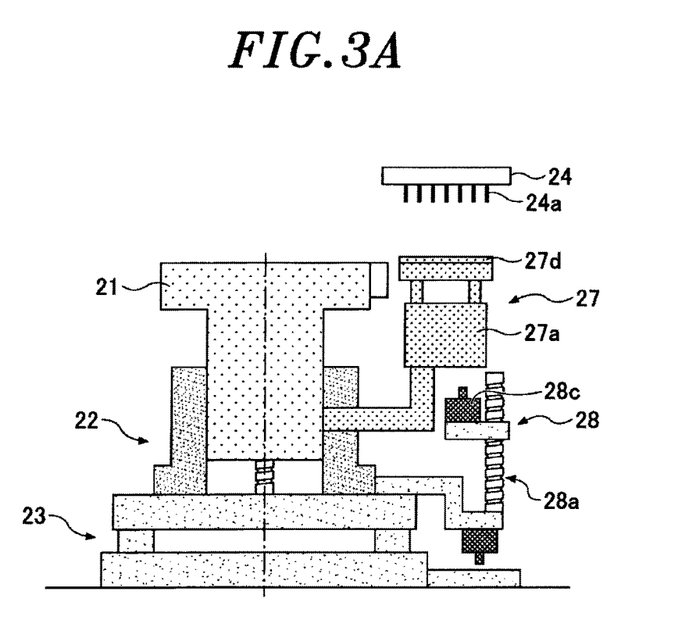
FIGS. 3A to 3D explain examples of a needle trace transcription method according to an embodiment of the present invention.

First, as shown in FIG. 3A, the mounting table 21 is moved in the horizontal direction by the XY stage 23 so that the support base 27 (the needle trace transfer member 27d) is positioned directly below the probe card 24.

Figure 3B:
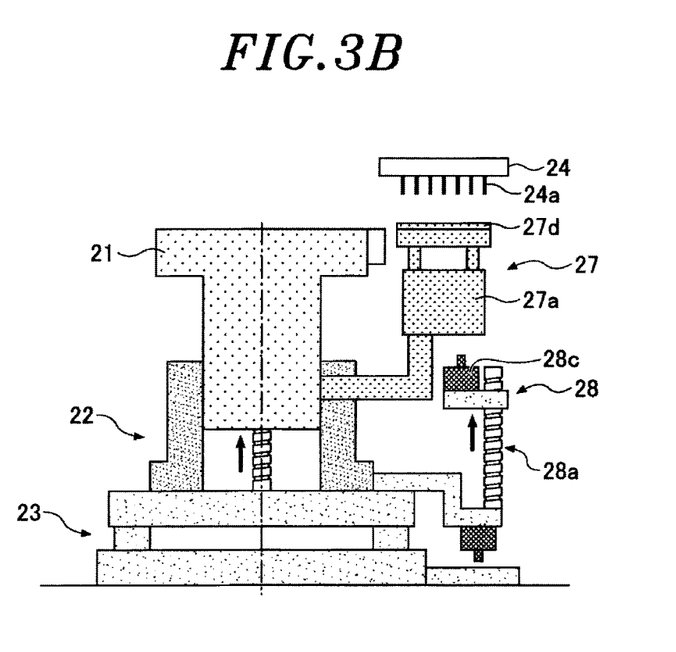

Next, as shown in FIG. 3B, the mounting table 21 is raised by the elevating mechanism 22 such that a distance between the needle tips of the probes 24a of the probe card 24 and the upper surface of the needle trace transfer member 27d becomes a predetermined distance (e.g., 500 µm). Further, the first lock mechanism 28c is raised by the actuator 28a such that a distance between the upper end of the contact portion of the first lock mechanism 28c and the bottom surface of the fixed portion 27a becomes a predetermined distance (e.g., 3 mm). The mounting table 21 and the first lock mechanism 28c may be raised simultaneously or sequentially.

Figure 3C:
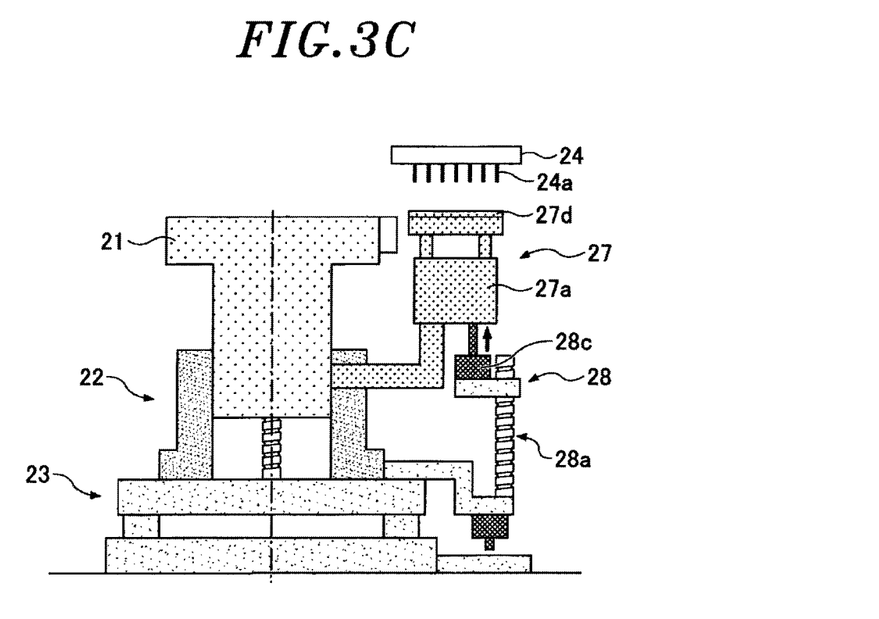

Then, as shown in FIG. 3C, the contact portion of the first lock mechanism 28c is raised to bring the upper end of the contact portion into contact with the bottom surface of the fixed portion 27a and lock the first lock mechanism 28c. After the first lock mechanism 28c is locked, it is preferred to raise the first lock mechanism 28c by a predetermined distance (e.g., 10 µm) using the actuator 28a in a state where the mounting table 21 is fixed.

Figure 3D:
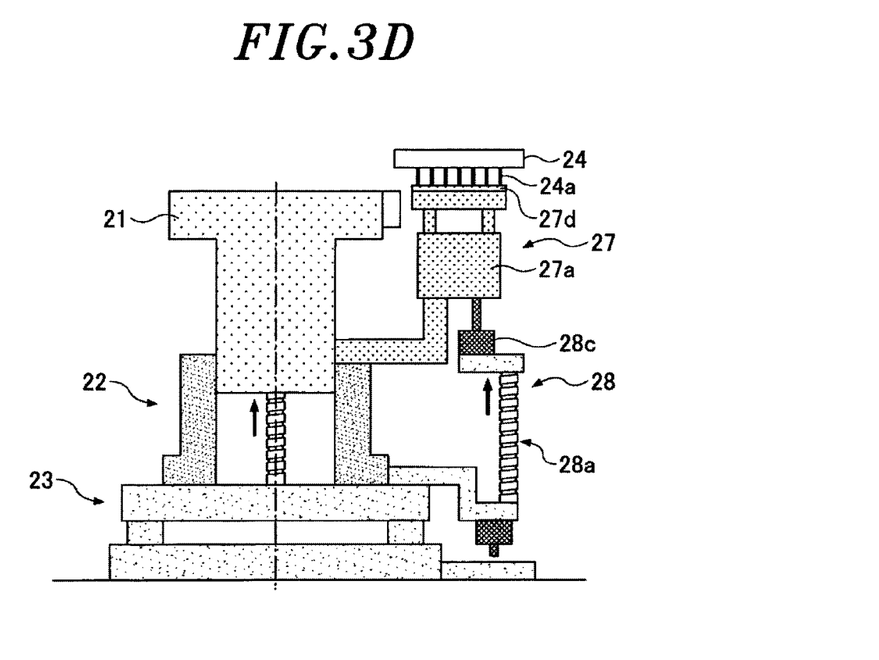

Next, as shown in FIG. 3D, the mounting table 21 and the first lock mechanism 28c are raised simultaneously by the elevating mechanism 22 and the actuator 28a to bring the probes 24a into contact with the needle trace transfer member 27d. Therefore, the needle traces of the probes 24a can be transferred to the needle trace transfer member 27d. At this time, in the embodiment of the present invention, the bottom surface of the support base 27 having the needle trace transfer member 27d is supported by the movable support unit 28, so that the support base 27 is prevented from being inclined downward. Accordingly, the needle tips of the probes 24a can be brought into perpendicular contact with the needle trace transfer member 27d, which prevents a non-uniform shape of the needle traces transferred to the needle trace transfer member 27d or positional misalignment of the needle traces. As a result, it is possible to suppress deterioration in the transfer accuracy of the needle traces of the probes 24a and improve the accuracy of alignment between the probes 24a and the electrode pads of the semiconductor wafer W.

Effects

The technical effects obtained by using the above-described probe device 1 will be described.

First, in the above-described probe device 1, a load of 50 kg was applied to the needle trace transfer member 27d from above in a state where the support base 27 was supported by the movable support unit 28 and in a state where the support base 27 was not supported by the movable support unit 28, and a moving distance of the needle trace transfer member 27d in the horizontal direction (Y direction) was measured.

Figure 4:
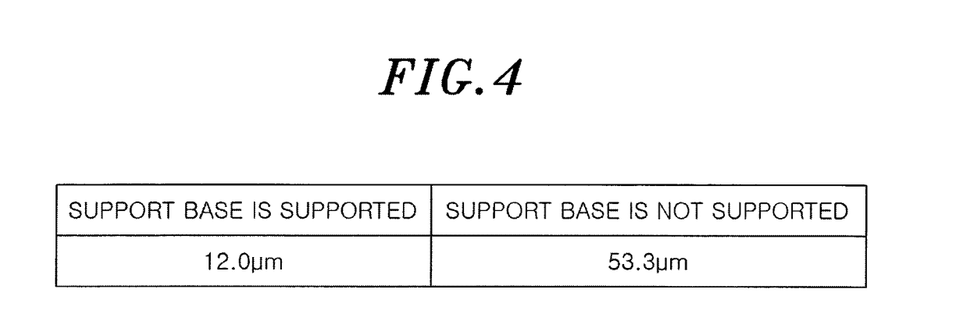
FIG. 4 explains technical effects obtained by using the probe device shown in FIG. 1.

FIG. 4 explains the technical effect obtained by using the probe device of FIG. 1. FIG. 4 shows the moving distance in the Y direction of the movable portion 27b on which the needle trance transfer member 27d is mounted at the time of applying a load of 50 kg to the needle trace transfer member 27d in a state where the support base 27 is supported by the movable support unit 28 and in a state where the support base 27 is not supported by the movable support unit 28.

As shown in FIG. 4, in a state where the support base 27 was supported by the movable support unit 28, the moving amount of the movable portion 27b in the Y direction was 12 µm. On the other hand, in a state where the support base 27 was not supported by the movable support unit 28, the moving distance of the movable portion 27b in the Y direction was 53.3 µm. In other words, it was found that by supporting the support base 27 by the movable support unit 28, the movement amount of the movable portion 27b in the horizontal direction can be reduced and, further, the movement amount of the needle trace transfer member 27d in the horizontal direction can be reduced.

Next, in the above-described probe device 1, the positions of the needle traces of the probes 24a transferred to the trace transfer member 27d were detected and evaluated in a state where the support base 27 was supported by the movable support unit 28 and in a state where the support base 27 was not supported by the movable support unit 28.

Figure 5A:
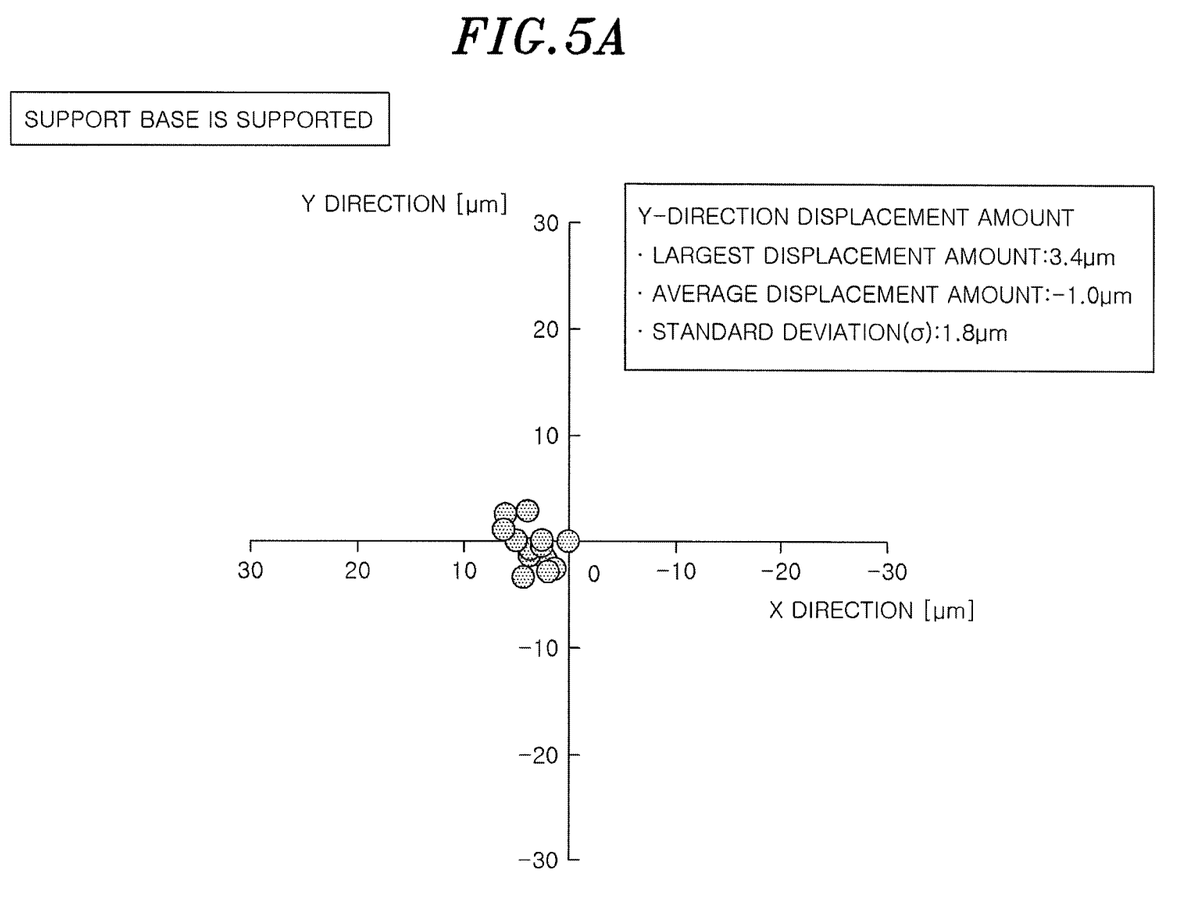
FIGS. 5A and 5B explain technical effects obtained by using the probe device shown in FIG. 1.
Figure 5B:
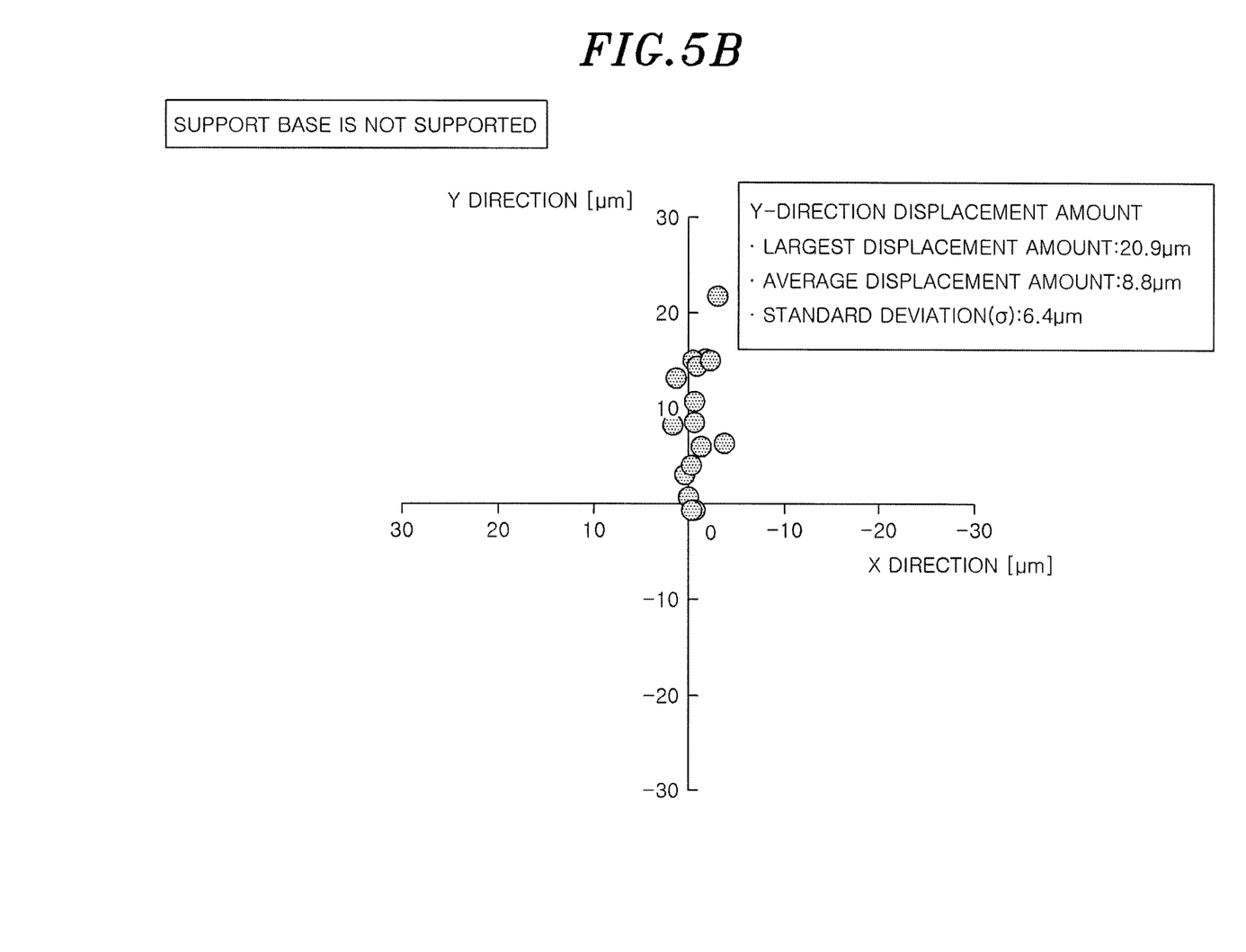

FIGS. 5A and 5B explain the technical effects obtained by using the probe device of FIG. 1. FIGS. 5A and 5B show the positions of the needle traces of the probes 24a transferred to the needle trace transfer member 27d in a state where the support base 27 was supported by the movable support unit 28 and in a state where the support base 27 was not supported by the movable support unit 28, respectively. In FIGS. 5A and 5B, the horizontal axis and the vertical axis respectively represent relative positions in the X direction and the Y direction from the positions (the origin) of the needle traces in a state where the support base 27 is not inclined downward.

As shown in FIG. 5A, when the support base 27 was supported by the movable support unit 28, the positions of the needle traces transferred to the needle trace transfer member 27d were hardly displaced compared to the positions of the needle traces detected in a state where the support base 27 was not inclined downward. In the present example, the largest displacement amount of the needle traces in the Y direction among the needle traces of the probes 24a was 3.4 μm. The average of the displacement amounts in the Y direction of the needle traces of the probes 24a was −1.0 μm, and the standard deviation σ was 1.8 μm.

On the other hand, as shown in FIG. 5B, when the support base 27 was not supported by the movable support unit 28, the positions of the needle traces transferred to the needle trace transfer member 27d were considerably displaced in the Y direction compared to the positions of the needle trances detected in the state where the support base 27 was not inclined downward. In the present embodiment, the largest displacement amount of the needle traces in the Y direction among the needle traces of the probes 24a was 20.9 μm. The average of the displacement amounts in the Y direction of the needle traces of the probes 24a was 8.8 μm, and the standard deviation σ was 6.4 μm.

From the above, it is clear that the probe device 1 according to the embodiment of the present invention can improve the transfer accuracy of the needle traces of the probes 24a and the accuracy of alignment between the probes 24a and the electrode pads of the semiconductor wafer W.

While the embodiments of the present invention have been described, the present invention is not limited thereto, and various changes and modifications can be made within the scope of the present invention.

This application claims priority to Japanese Patent Application No. 2011-123644 filed on Jun. 23, 2011, the entire contents of which are incorporated herein by reference.

DESCRIPTION OF REFERENCE NUMERALS

1: probe device
10: loader chamber
20: prober chamber
21: mounting table
22: elevating mechanism
22a: shaft portion
22b: guide portion
23: XY stage
23a: first base portion
23b: second base portion
24: probe card
24a: probe
24b: head plate
25: alignment mechanism
25a: first image capturing unit
25b: second image capturing unit
25c: alignment bridge
26: fixed support portion
27: support base
27a: fixed portion
27b: movable portion
27c: elevating mechanism
27d: needle trace transfer member
28: movable support unit
28a: actuator
28b: third base portion
28c: first lock mechanism
28d: second lock mechanism
28e: fourth base portion
281a: shaft
p82a: nut

The invention claimed is:

1. A probe device for bringing an inspection target object mounted on a mounting table into electrical contact with probes and inspecting electrical characteristics of the inspection target object, the probe device comprising:
   a support base having on an upper surface thereof a needle trace transfer member configured to transfer needle traces of the probes;
   a fixed support portion attaching and extending extending from a side of the mounting table and configured to fix and support the support base from below; and
   a movable support unit that is detached from the support base and is configured to be moved vertically to be in contact with the support base and movably support the support base.

2. The probe device of claim 1, wherein the movable support unit includes a first lock mechanism to be in contact with a bottom surface of the support base, and an actuator configured to vertically move the first lock mechanism.

3. The probe device of claim 2, wherein the first lock mechanism is an air lock type lock mechanism.

4. The probe device of claim 2, further comprising:
   a first base portion configured to move the mounting table in a first horizontal direction; and
   a second base portion disposed on the first base portion and configured to move the mounting table in a second horizontal direction orthogonal to the first horizontal direction,
   wherein one end of the actuator is fixed to the second base portion.

5. The probe device of claim 4, further comprising:
   an elevating mechanism configured to vertically move the mounting table with respect to the second base portion;
   wherein when the needle traces of the probes are transferred to the needle trace transfer member, the elevating mechanism and the actuator are driven simultaneously to raise the mounting table and the movable support unit.

6. A needle trace transcription method for transferring needle traces of probes to a needle trace transfer member to align the probes and electrodes of an inspection target object mounted on a mounting table in a probe device for bringing the inspection target object into electrical contact with the probes and inspecting electrical characteristics of the inspection target object, the needle trance transcription method comprising:
   bringing a movable support unit vertically movable from a position detached from a support base into contact with a bottom surface of the support base, wherein the support base has on an upper surface thereof the needle trace transfer member and is fixedly supported by a fixed support portion attaching and extending extending from a side of the mounting table; and bringing the probes into contact with the needle trace transfer member by raising the mounting table and the movable support unit simultaneously.

7. The needle trace transcription method of claim 6, further comprising: before said bringing the movable support unit into contact with the bottom surface of the support base, raising the mounting table such that a distance between the probes and an upper surface of the needle trace transfer member becomes a predetermined distance.

8. The needle trace transcription method of claim 6, further comprising: after said bringing the movable support unit into contact with the bottom surface of the support base, raising the movable support unit by a predetermined distance in a state where the mounting table is fixed.

\* \* \* \* \*